(12) United States Patent
Forrest et al.

(10) Patent No.: US 9,385,348 B2
(45) Date of Patent: Jul. 5, 2016

(54) ORGANIC ELECTRONIC DEVICES WITH MULTIPLE SOLUTION-PROCESSED LAYERS

(71) Applicant: THE REGENTS OF THE UNIVERSITY OF MICHIGAN, Ann Arbor, MI (US)

(72) Inventors: Stephen R. Forrest, Ann Arbor, MI (US); Brian E. Lassiter, San Francisco, CA (US); Jeramy D. Zimmerman, Golden, CO (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 14/817,979

(22) Filed: Aug. 4, 2015

(65) Prior Publication Data

US 2016/0006002 A1    Jan. 7, 2016

Related U.S. Application Data

(63) Continuation-in-part of application No. 14/473,995, filed on Aug. 29, 2014, now Pat. No. 9,099,652.

(60) Provisional application No. 61/871,535, filed on Aug. 29, 2013.

(51) Int. Cl.
*H01L 21/02* (2006.01)
*H01L 51/56* (2006.01)
(Continued)

(52) U.S. Cl.
CPC .............. *H01L 51/56* (2013.01); *H01L 51/001* (2013.01); *H01L 51/0003* (2013.01);
(Continued)

(58) Field of Classification Search
CPC . H01L 51/003; H01L 51/007; H01L 51/0072; H01L 51/0085; H01L 51/50; H01L 51/5012; H01L 51/5016; H01L 51/5036; H01L 51/5044; H01L 51/5096; H01L 51/56
USPC ...................................... 438/46–52
See application file for complete search history.

(56) References Cited

U.S. PATENT DOCUMENTS 5,703,436 A    12/1997 Forrest et al.
6,310,360 B1   10/2001 Forrest et al.
(Continued)

FOREIGN PATENT DOCUMENTS

KR    10-2011-0065483 A1    6/2011

OTHER PUBLICATIONS

Chesterfield, R. et al., "Solution-Coating Technology for AMOLED Displays", Frontline Technology, Information Display, Jan. 2011, pp. 24-30.
(Continued)

*Primary Examiner* — Michael Lebentritt
(74) *Attorney, Agent, or Firm* — Duane Morris LLP

(57) ABSTRACT

A method for fabricating an organic light emitting device stack involves depositing a first conductive electrode layer over a substrate; depositing a first set of one or more organic layers, wherein at least one of the first set of organic layers is a first emissive layer and one of the first set of organic layers is deposited by a solution-based process that utilizes a first solvent; depositing a first conductive interlayer by a dry deposition process; and depositing a second set of one or more organic layers, wherein at least one of the second set of organic layers is a second emissive layer and one of the second set of organic layers is deposited by a solution-based process that utilizes a second solvent, wherein all layers that precede the layer deposited using the second solvent are insoluble in the second solvent.

27 Claims, 8 Drawing Sheets

(51) Int. Cl.
*H01L 51/50* (2006.01)
*H01L 51/52* (2006.01)
*H01L 51/00* (2006.01)
H01L 51/42 (2006.01)
H01L 27/30 (2006.01)

(52) U.S. Cl.
CPC ....... *H01L 51/0007* (2013.01); *H01L 51/0021* (2013.01); *H01L 51/0026* (2013.01); *H01L 51/0028* (2013.01); *H01L 51/0047* (2013.01); *H01L 51/504* (2013.01); *H01L 51/5278* (2013.01); *H01L 27/302* (2013.01); *H01L 51/424* (2013.01); *H01L 51/5056* (2013.01); *H01L 51/5072* (2013.01); *H01L 51/5088* (2013.01); *H01L 51/5092* (2013.01); *H01L 51/5096* (2013.01); *H01L 51/5206* (2013.01); *H01L 51/5221* (2013.01)

(56) References Cited

U.S. PATENT DOCUMENTS

| | | | |
|---|---|---|---|
| 7,285,432 B2 | 10/2007 | Kwong et al. | |
| 8,288,187 B2 | 10/2012 | Cheon et al. | |
| 2001/0000005 A1 | 3/2001 | Forrest et al. | |
| 2004/0031965 A1 | 2/2004 | Forrest et al. | |
| 2004/0262614 A1 | 12/2004 | Hack et al. | |
| 2005/0110005 A1 | 5/2005 | Forrest et al. | |
| 2006/0029725 A1* | 2/2006 | Kwong | H01L 51/0003 427/66 |
| 2006/0170337 A1* | 8/2006 | Lee | C09K 11/06 313/504 |
| 2006/0273714 A1 | 12/2006 | Forrest et al. | |
| 2006/0279203 A1* | 12/2006 | Forrest | H01L 51/0072 313/504 |
| 2006/0279204 A1 | 12/2006 | Forrest et al. | |
| 2007/0116983 A1 | 5/2007 | Kanno et al. | |
| 2007/0176167 A1* | 8/2007 | Parthasarathy | H01L 51/56 257/40 |
| 2007/0278937 A1 | 12/2007 | Forrest et al. | |
| 2008/0067530 A1 | 3/2008 | Forrest et al. | |
| 2008/0102310 A1 | 5/2008 | Thompson et al. | |
| 2008/0197768 A1* | 8/2008 | Conway | C09K 11/06 313/504 |
| 2008/0238310 A1* | 10/2008 | Forrest | H01L 51/5275 313/506 |
| 2008/0265757 A1 | 10/2008 | Forrest et al. | |
| 2009/0130296 A1 | 5/2009 | Kwong et al. | |
| 2009/0278444 A1 | 11/2009 | Forrest et al. | |
| 2010/0033082 A1* | 2/2010 | Liu | H01L 51/0007 313/504 |
| 2010/0181899 A1 | 7/2010 | Forrest et al. | |
| 2010/0258788 A1* | 10/2010 | Radu | C07C 211/54 257/40 |
| 2010/0258821 A1 | 10/2010 | Forrest et al. | |
| 2011/0045196 A1 | 2/2011 | Forrest et al. | |
| 2011/0174367 A1 | 7/2011 | Hayashi et al. | |
| 2011/0177641 A1* | 7/2011 | Cheon | H01L 51/0003 438/46 |
| 2011/0215301 A1 | 9/2011 | Forrest | |
| 2011/0241046 A1 | 10/2011 | Forrest | |
| 2011/0253206 A1 | 10/2011 | Maeda et al. | |
| 2012/0001536 A1 | 1/2012 | Zhang et al. | |
| 2012/0018716 A1* | 1/2012 | Zhao | C08F 20/18 257/40 |
| 2012/0061658 A1 | 3/2012 | Forrest et al. | |
| 2012/0216866 A1 | 8/2012 | Kato et al. | |
| 2013/0019949 A1 | 1/2013 | Wong et al. | |
| 2013/0112951 A1 | 5/2013 | Xia et al. | |
| 2013/0146850 A1 | 6/2013 | Pieh et al. | |
| 2013/0236999 A1 | 9/2013 | Lee et al. | |
| 2013/0240840 A1 | 9/2013 | Forrest et al. | |
| 2013/0240850 A1 | 9/2013 | Forrest et al. | |
| 2013/0293082 A1 | 11/2013 | Forrest et al. | |
| 2014/0061594 A1 | 3/2014 | Forrest et al. | |
| 2014/0127625 A1 | 5/2014 | Defranco et al. | |
| 2014/0203244 A1 | 7/2014 | Hack et al. | |

OTHER PUBLICATIONS

"Solution-Processed Organic Light-Emitting Diodes Materials", Lumtec—Luminescence Technology Corp., retrieved from http://www.lumtec.com.tw.; 21 pages, (undated).

Chen, G. et al., "Solution-processed organic photovoltaic cells based on a squaraine dye", Phys. Chem, Chem, Phys., 2012, 14:14661-14666.

ISR/Written Opinion issued Nov. 28, 2014, in counterpart PCT application No. PCT/US2014/053597.

\* cited by examiner

ORGANIC ELECTRONIC DEVICES WITH MULTIPLE SOLUTION-PROCESSED LAYERS

CROSS-REFERENCE TO RELATED APPLICATION

This application is a continuation-in-part of U.S. application Ser. No. 14/473,995, filed on Aug. 29, 2014, which claims the benefit under 35 U.S.C. §119(e) of U.S. Provisional Application Ser. No. 61/871,535, filed on Aug. 29, 2013.

GOVERNMENT RIGHTS

This invention was made with Government support from the Department of Energy under contract Nos. DE-SC0000957 and DE-SC0001013, and United States Air Force—Air Force Office of Scientific Research under contract No. FA9550-10-1-0339. The United States Government has certain rights to this invention.

JOINT RESEARCH AGREEMENT

The claimed invention was made by, on behalf of, and/or in connection with one or more of the following parties to a joint university corporation research agreement(s): Regents of the University of Michigan, Princeton University, University of Southern California, Global Photonic Energy Corporation, and/or Universal Display Corporation. The agreement(s) was in effect on and before the date the claimed invention was made, and the claimed invention was made as a result of activities undertaken within the scope of the agreement(s).

FIELD OF THE INVENTION

The present disclosure is related to the field of organic light emitting devices, organic photoactive devices, and methods of fabricating such devices.

BACKGROUND

In organic electronic devices such as organic photovoltaics (OPVs), organic light emiting devices (OLEDs), and organic solid state lasers it is common to utilize multi-layer structures. While this is typically a simple process for vacuum-processed films, problems arise for solution-processed films. When multi-layer structures are fabricated from solution-processed films, the underlying layers can be re-dissolved, as orthogonal solvents are uncommon.

Here, the inventors present a method of decreasing the re-dissolution of underlying organic layers by incorporating solvent vapor annealing (SVA). The inventors have devised a compound protection layer scheme to allow solution processing of multi-layer organic film structures. The process scheme is useful where orthogonal solvents are not available. The process scheme can be useful for such technologies as fabrication of OPVs and OLEDs as examples.

The inventors have verified the compound protection scheme by fabricating a stacked OPV device structure. The first solution processed layer is coated with a layer, in this case a fullerene, that is insoluble in the solvent used in depositing the second solution processed layer. By SVA the first layer after the deposition of the fullerne, the first solution processed layer becomes densified. Next, a very thin metal oxide layer is deposited completing the compound protection layer of fullerene+metal oxide. Then, on deposition of the second solution processed layer using a solvent (trimethylformamine) that is less effective in redissolving the first layer (functionalized squaraines) than its original solvent (chloroform) that have since been SVA, the first layer is undamaged and high performance stacked OPV cells result.

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into an electrical signal or electricity. Solar cells, also called photovoltaic ("PV") devices, are a type of photosensitive optoelectronic device that is specifically used to generate electrical power. Photoconductor cells are a type of photosensitive optoelectronic device that are used in conjunction with signal detection circuitry which monitors the resistance of the device to detect changes due to absorbed light. Photodetectors, which may receive an applied bias voltage, are a type of photosensitive optoelectronic device that are used in conjunction with current detecting circuits which measures the current generated when the photodetector is exposed to electromagnetic radiation.

These three classes of photosensitive optoelectronic devices may be distinguished according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias.

As used herein, the term "rectifying" denotes, inter alia, that an interface has an asymmetric conduction characteristic, i.e., the interface supports electronic charge transport preferably in one direction. The term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct (i.e., transport) electric charge in a material. The term "photoconductive material" refers to semiconductor materials which are utilized for their property of absorbing electromagnetic radiation to generate electric charge carriers. As used herein, "top" means furthest away from the substrate, while "bottom" means closest to the substrate. Where a first layer is described as being "on" or "over" a second layer, there may be intervening layers, unless it is specified that the first layer is "in physical contact with" the second layer.

SUMMARY

According to an aspect of the present disclosure, a method for fabricating an OLED stack is disclosed. The method comprises:

(a) depositing a first conductive electrode layer over a substrate;

(b) depositing a first set of one or more organic layers, wherein at least one of the first set of organic layers is a first emissive layer and one of the first set of organic layers is deposited by a solution-based process that utilizes a first solvent;

(c) depositing a first conductive interlayer by a dry deposition process; and (d) depositing a second set of one or more organic layers, wherein at least one of the second set of organic layers is a second emissive layer and one of the second set of organic layers is deposited by a solution-based process that utilizes a second solvent, wherein all layers that precede the layer deposited using the second solvent are insoluble in the second solvent.

According to another aspect of the present disclosure, another method for fabricating an OLED stack is disclosed. The method comprises:
(a) depositing a first conductive electrode layer over a substrate;
(b) optionally depositing a first set of one or more functional layers by a dry deposition process;
(c) depositing a first emissive layer by solution-based process of an emissive material dissolved in a first solvent;
(d) optionally depositing a second set of one or more functional layers by a dry deposition process;
(e) depositing a first conductive interlayer by a dry deposition process;
(f) optionally depositing a third set of one or more functional layers by a dry deposition process;
(g) depositing a second emissive layer by solution-based process of the emissive material dissolved in a second solvent, wherein the second set of one more functional layers, the conductive interlayer, and the third set of one or more functional layers are insoluble in the second solvent;
(h) optionally depositing a fourth set of one or more functional layers by a dry deposition process; and
(i) depositing a second conductive electrode layer or second conductive interlayer by a dry deposition process.

According to an embodiment of the present disclosure, a method of fabricating an organic photosensitive device stack is provided. The method comprises:
(a) depositing a first conductive electrode layer over a substrate;
(b) depositing a first layer of an organic electron donor type material film over the substrate by solution-processing the organic electron donor type dissolved in a first solvent;
(c) depositing a first layer of an organic electron acceptor type material over the first layer of the organic electron donor type material film by a dry deposition process, resulting in an interim stack;
(d) depositing a conductive layer over the interim stack by a dry deposition process;
(e) depositing a second layer of the organic electron donor type film over the conductive layer by solution-processing of the organic electron donor type material dissolved in a second solvent, wherein the organic electron acceptor type material and the conductive layer are insoluble in the second solvent;
(f) depositing a second layer of an organic electron acceptor type material over the second layer of the organic electron donor type material film by a dry deposition process, resulting in a stack; and
(g) depositing a second conductive electrode layer over the stack.

According to an embodiment, the interim stack can be annealed after the step (c) but before the step (d). According to another embodiment, the stack can be annealed after the step (f) but before the step (g). In another embodiment, the method steps recited above can be implemented in reverse order as appropriate to fabricate an OPV stack in a configuration that is inverted from the one described above.

According to another aspect of the present disclosure, a method for fabricating an OLED stack is disclosed. The method comprises:
(a) depositing a first conductive electrode layer over a substrate;
(b) depositing a first hole injection layer (HIL) by a dry deposition process;
(c) depositing a first hole transport layer (HTL) by a dry deposition process;
(d) depositing a first emissive layer by solution-based process of an emissive material dissolved in a first solvent;
(e) depositing an electron transport layer by a dry deposition process;
(f) depositing a first conductive interlayer by a dry deposition process;
(g) depositing a second HIL by a dry deposition process;
(h) depositing a second HTL by a dry deposition process;
(i) depositing a second emissive layer by solution-based process of the emissive material dissolved in a second solvent, wherein the electron transport layer and the conductive interlayer is insoluble in the second solvent;
(j) depositing a second electron transport layer by a dry deposition process; and
(k) depositing a second conductive interlayer by a dry deposition process. According to an embodiment, the first emissive layer can be annealed after the step (d) but before the step (e). According to another embodiment, the second emissive layer can be annealed after the step (i) but before the step (j).

According to another aspect of the present disclosure, a method for fabricating a multilayered hole injection layer in an OLED is disclosed. The method comprises:
(a) depositing a first conductive electrode layer over a substrate;
(b) depositing an organic material as a first hole injection layer over the substrate by a solution-based process;
(c) depositing a layer of $MoO_3$ by a dry deposition process, resulting in a stack; and
(d) depositing the organic material as a second hole injection layer over the $MoO_3$ layer by a solution-based process. After the step (d) the remaining functional layers of the OLED would be completed in order to fabricate a complete OLED. According to an embodiment, the first hole injection layer can be annealed after the step (b) and before the step (c). According to another embodiment, the second hole injection layer can be annealed after the step (d). In another embodiment, the method steps recited above can be implemented in reverse order as appropriate to fabricate an OLED stack or a multilayered HIL in a configuration that is inverted from those recited above.

BRIEF DESCRIPTION OF THE DRAWINGS

The features shown in the above referenced drawings are illustrated schematically and are not intended to be drawn to scale nor are they intended to be shown in precise positional relationship. Like reference numbers indicate like elements.

DETAILED DESCRIPTION

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

As used herein, the term "organic" includes polymeric materials as well as small molecule organic materials that may be used to fabricate organic opto-electronic devices. "Small molecule" as used herein refers to any organic material that is not a polymer, and "small molecules" may actually be quite large. Small molecules may include repeat units in some circumstances. For example, using a long chain alkyl group as a substitute does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule." In general, a small molecule has a defined chemical formula with a molecular weight that is the same from molecule to molecule, whereas a polymer has a defined chemical formula with a molecular weight that may vary from molecule to molecule. As used herein, "organic" includes metal complexes of hydrocarbyl and heteroatom-substituted hydrocarbyl ligands.

An organic photosensitive device comprises at least one photoactive region in which light is absorbed to form an exciton, which may subsequently dissociate into an electron and a hole. The photoactive region will typically comprise a donor-acceptor heterojunction, and is a portion of a photosensitive device that absorbs electromagnetic radiation to generate excitons that may dissociate in order to generate an electrical current.

The substrate may be any suitable substrate that provides desired structural properties. The substrate may be flexible or rigid, planar or non-planar. The substrate may be transparent, translucent or opaque. Rigid plastics and glass are examples of preferred rigid substrate materials. Flexible plastics and metal foils are examples of preferred flexible substrate materials.

Figure 1A:
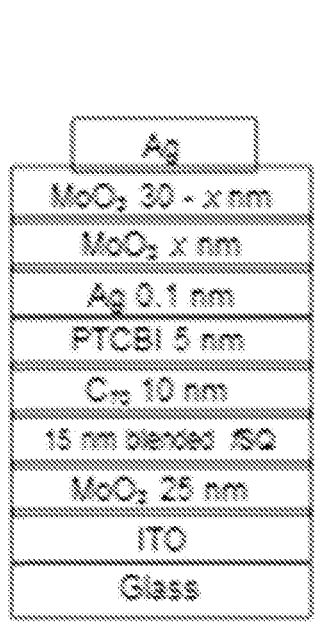
FIGS. 1(a)-1(c) show schematic cross-sectional diagrams of OPV device structures constructed by the inventors (a) Front-only discrete cell, (b) Back-only discrete cell, and (c) stacked OPV, used by the inventors.
Figure 1B:
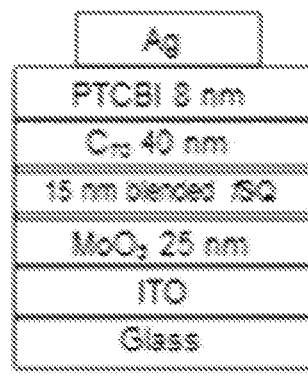
Figure 1C:
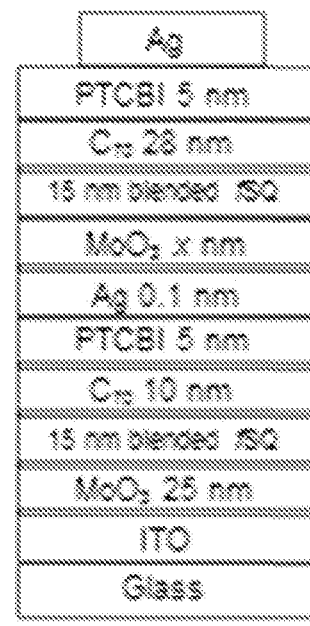

Referring to FIGS. 1(a)-1(c), schematic diagrams of device structures constructed by the inventors are illustrated. FIG. 1(a) shows a "front-only" discrete cell that was constructed to represent a front cell of a stacked OPV structure. "Front-only" cell refers to the cell in a stacked cell structure that is closer to the anode. FIG. 1(b) shows a "back-only" discrete cell that was constructed to represent a back cell portion of a stacked OPV structure. "Back-only" cell refers to the cell in a stacked cell structure that is closer to the cathode. FIG. 1(c) shows a full stacked cell structure.

Figure 1D:
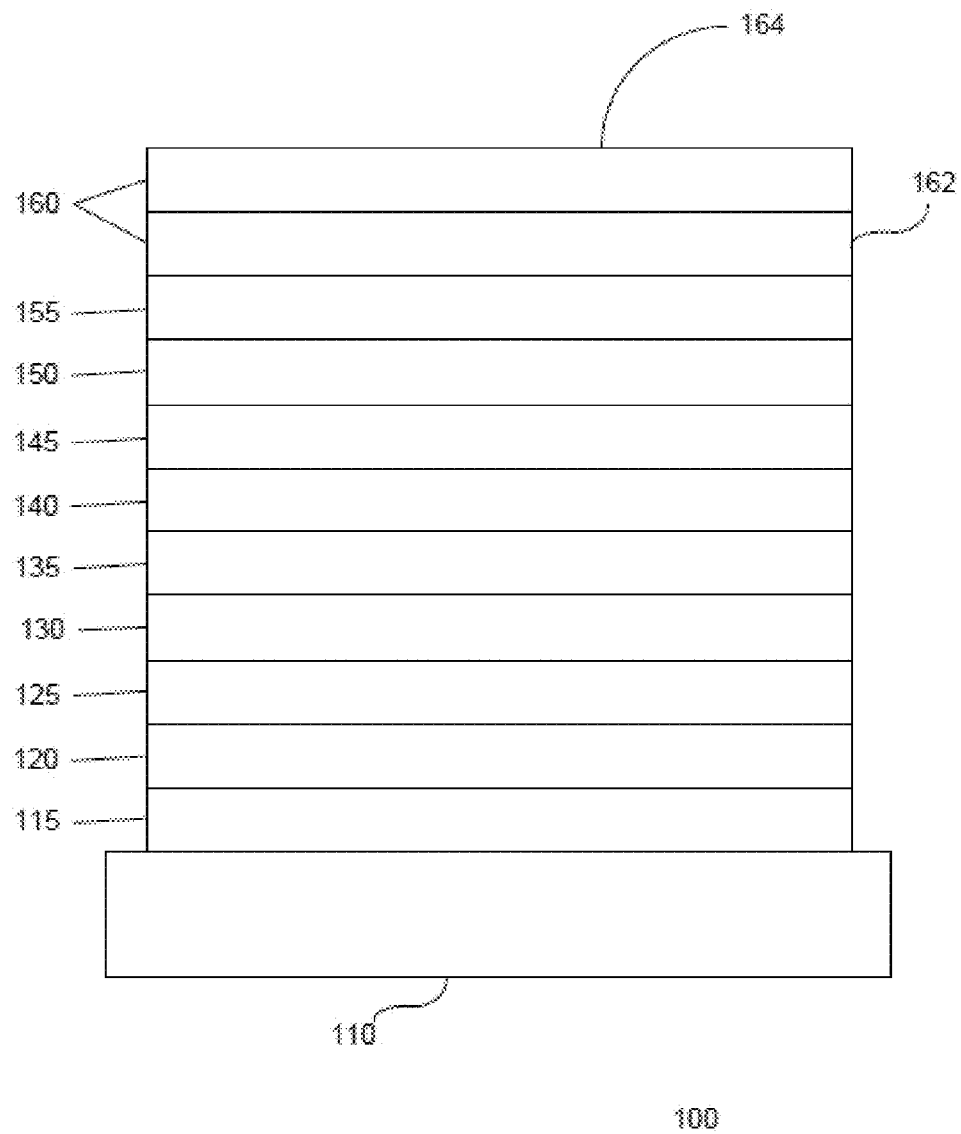
FIG. 1(d) shows cross-sectional diagram of an example of an architecture for an organic light emitting device.

FIG. 1(d) shows an example of an organic light emitting device 100. Device 100 may include a substrate 110, an anode 115, a hole injection layer 120, a hole transport layer 125, an electron blocking layer (optional) 130, an emissive layer 135, a hole blocking layer (optional) 140, an electron transport layer 145, an electron injection layer 150, a protective layer 155, a cathode 160, and a barrier layer 170. Cathode 160 can be a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

Figure 1E:
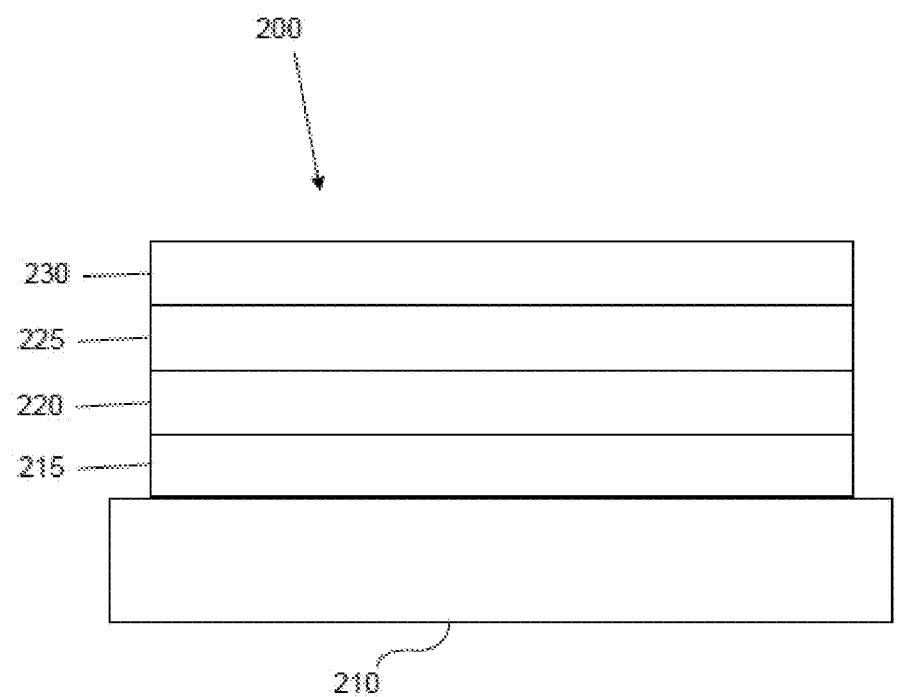
FIG. 1(e) shows schematic cross-sectional diagram of an example of an inverted organic light emitting device structure that does not have a separate electron transport layer.

FIG. 1(e) shows an example of an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 1(e) provides one example of how some layers may be omitted from the structure of device 100.

The simple layered structures illustrated in FIGS. 1(a)-1(e) are provided by way of non-limiting examples, and it is understood that embodiments of the invention may be used in connection with a wide variety of other structures for OPVs and OLEDs.

The names given to the various layers in the FIGS. 1(a)-1(e) are not intended to be strictly limiting. For example, in device 200, hole transport layer 225 transports holes and injects holes into emissive layer 220, and may be described as a hole transport layer or a hole injection layer.

The inventors have fabricated a partially solution-processed small molecule stacked organic photovoltaic organic/inorganic interlayer structure example that provides efficient charge recombination while protecting the underlying layers from degradation due to attack from solvents applied during the deposition of subsequent sub-cells. In this example, each sub-cell consists of functionalized squaraine (fSQ) blend as the organic electron donor type material that is cast from solution, followed by evaporation of other functional layers. The first fSQ layer was cast from chloroform, while the second was cast from a tetrahydrofuran, thereby minimizing dissolution of the underlying fullerene layer, the organic electron acceptor type material, that is relatively insoluble in tetrahydrofuran and acts to protect the first donor layer. The organic layers were annealed, by solvent vapor annealing, to increase the sub-cell performance while decreasing the damage caused by spin-coating of the second fSQ layer, both of which result from increased film crystallinity that reduces the rate of solvent penetration. Depending on the particular organic semiconductor materials used, the annealing can be accomplished by solvent vapor annealing or thermal annealing. The stacked cells exhibited a power conversion efficiency of 6.2±0.3% and an open circuit voltage nearly equal to the sum of the constituent sub-cells.

Significant progress in improving the performance of organic photovoltaic (OPV) cells has been made possible through innovations in device architecture, materials, and processing. In particular, the stacked OPV design provides a flexible solution to achieving the highest cell efficiencies, where the open-circuit voltage ($V_{OC}$) can be matched with the incident photon energies by employing one sub-cell that absorbs high energy photons and a second that absorbs at lower energies, thereby decreasing thermalization losses. Stacked OPVs utilizing small molecules have recently been demonstrated with power conversion efficiencies of $\eta_P$=8.3%. Solution-processing is a useful means for fabricating polymer, and possibly small molecule-based stacked OPVs comprised of materials that are incompatible with vacuum deposition. Also, solution processed materials are often compatible with solvent vapor annealing. Solvent vapor annealing has proven effective in increasing the exciton diffusion length and charge collection efficiency.

Disclosed herein is a novel method for solution-processing deposition of multiple layers of organic films that can be applied to expand the tools available for fabricating stacked OLEDs and stacked OPVs. The method allows non-destructive solution deposition of sub-cells in both the lower and upper stacked elements by employing an optically thin organic/inorganic protection layer between the annealed organic elements.

Early stacked OPVs consisted of two small molecule subcells separated by a metal-containing interfacial layer that promotes charge recombination. This was followed by demonstration of stacked OPVs consisting of a polymer sub-cell in a stack with a small molecule-based sub-cell, and with two polymer active layers. When both sub-cells consist of solution-processed polymers, the interconnecting layers must provide a barrier to protect the underlying cell from being redissolved when the second sub-cell is deposited. For example, poly(ethylene dioxythiophene)/poly(styrene sulfonic acid) (PEDOT:PSS) has been used because of its insolubility in chlorinated solvents typically employed for the deposition of active-layer materials.

Multiple layers such as $TiO_2$/PEDOT:PSS, ZnO/self-assembled monolayers, and $TiO_2$/Al/$MoO_3$ have also been used to prevent redissolving of the active layers. The drawback of these methods is that the protection layers must be relatively thick (>30 nm) to limit the penetration of solvents through pin-holes or other physical defects in the layer. Thick layers, however, have the disadvantage that they may prevent optimization of the optical field distribution within the cell to maximize the photocurrent. This is possibly a reason that small molecule-based stacked OPVs incorporating solution-processed active materials have not been demonstrated.

Tetrahydrofuran (THF) is an alternative to the ubiquitously used chlorinated solvents, often used in polymer synthesis, and as a solvent for some solution-processed OPVs. The boiling point and viscosity of THF is similar to that of chloroform (CF), with values of 66 and 61° C., and 0.48 and 0.54 cP, respectively. Small molecule materials such as functionalized squaraines (fSQs), have a comparable solubility in THF and CF (~2 mg/ml vs. ~8 mg/ml), allowing for deposition via spin-coating under similar conditions. However, the solubility for fullerenes such as $C_{60}$ and $C_{70}$ is drastically lower in THF (<0.01 mg/ml) than in CF (~0.16 mg/ml). This solubility "contrast" presents an opportunity for fabrication of stacked OPVs with multiple solution-processed small molecule layers. Similar to fullerenes, 3,4,9,10 perylenetetracarboxylic bisbenzimidazole (PTCBI) is also not soluble in THF and its solubility in THF would be similar to that of fullerenes.

According to an aspect of the present disclosure, a method of fabricating a stacked organic photosensitive device, such as a stacked OPV device is provided. The method comprises: (a) providing a substrate; (b) depositing a first conductive electrode layer over the substrate; (c) depositing a first layer of an organic electron donor type material over the substrate by solution-processing the organic electron donor type material dissolved in a first solvent; (d) depositing a first layer of an organic electron acceptor type material over the first layer of the organic electron donor type material film by a dry deposition process, resulting in an interim stack; (e) depositing a conductive layer over the interim stack by a dry deposition process; (f) depositing a second layer of the organic electron donor type material over the conductive layer by solution-processing of the organic electron donor type material dissolved in a second solvent, wherein the organic electron acceptor type material and the conductive layer are insoluble in the second solvent; (g) depositing a second layer of an organic electron acceptor type material over the second layer of the organic electron donor type material by a dry deposition process, resulting in a stack; and (h) depositing a second conductive electrode layer over the stack.

According to an embodiment, the interim stack can be optionally annealed after the step (d) but before the step (e). According to another embodiment, the stack can be optionally annealed after the step (g) but before the step (h).

In one embodiment, the organic electron donor type material is a small molecule material, functionalized squaraine (fSQ), the organic electron acceptor type material is a small molecule material, fullerene, the first solvent is chloroform or tetrahydrofuran, and the second solvent is tetrahydrofuran.

In one embodiment, the OPV embodiment of the method described above further comprises a step of annealing the interim stack before depositing the conductive layer over the interim stack. The method can further comprise a step of annealing the stack before depositing the second conductive electrode layer over the stack. The annealing can be solvent vapor annealing or thermal annealing.

The dry deposition process as referenced herein includes vacuum-processing such as vacuum thermal evaporation (VTE) and organic vapor phase deposition (OVPD), and other dry deposition process such as lamination.

In one embodiment, the dry deposition process is VTE process. The first conductive electrode layer is an anode and the second conductive electrode layer is a cathode. The conductive layer between the first cell and the second cell is a charge transport layer. The conductive layer can be formed from PTCBI.

In an example described below, we incorporate two solution- and vapor-processed, blended-fSQ sub-cells into a stacked OPV. One sub-cell consists of a blended-fSQ as the organic electron donor type material that is cast from a CF solution, followed by VTE of the fullerene as the organic electron acceptor type material and a conductive electron transport material layer of PTCBI. Next, a charge recombination layer consisting of a thin layer of Ag and $MoO_3$ is deposited by VTE before the second sub-cell layers are deposited. Charge recombination happens between the Ag and the $MoO_3$. The second sub-cell, also based on fSQs as the organic electron donor type material, is then deposited by solution-based process from a THF solution, thereby minimizing dissolution of the underlying fullerene, $C_{60}$, layer and the charge transport material (PCTBI) which are relatively insoluble in THF. The $C_{60}$ and PTCBI layers protect the blended fSQ donor layer.

Furthermore, annealing, by solvent vapor annealing (SVA) in this example, of the first sub-cell stack is found to simultaneously increase the sub-cell performance while decreasing any damage that can be caused by the solution-based processing of the second fSQ layer, both of which are due to the increased crystallinity in the film that reduces solvent penetration. The resulting stacked cell has a power conversion efficiency of $\eta_P=6.2\pm0.3\%$, and an open circuit voltage of $V_{OC}=1.78\pm0.01$ V, or nearly equal to the sum of the constituent sub-cells. Thus, annealing of the first sub-cell stack can be optionally implemented in the method of the present disclosure. For the electron donor type material and electron acceptor type material set of fSQ and fullerene, respectively, the first solvent can be chloroform or THF and the second solvent can be THF and the annealing by SVA consists of exposure to a dichloromethane vapor for about 5 to 10 minutes.

The methods described herein for the stacked OPV embodiment can be implemented to fabricate stacked OPVs in the inverted configuration with respect to the configurations described above. In the inverted configuration embodiment, the process steps described above would be implemented in the reverse order to fabricate the inverted configuration which would be readily understood by one of ordinary skill in the art.

According to an aspect of the present disclosure, the method of fabricating a stacked OPV device described above encompasses a variation wherein the first layer of electron donor type small molecule material is deposited over the substrate by a dry deposition process then the first layer of an electron acceptor type small molecule material is deposited over the first layer of the electron donor type small molecule material by a solution-processing, resulting in an interim stack. The electron acceptor type small molecule material is solution processed by the electron acceptor type small molecule material dissolved in a first solvent. Then, after a conductive layer is deposited over the interim stack by a dry deposition process, either the second layer of the electron donor type small molecule material film or the second layer of an electron acceptor type small molecule material film can be deposited by solution-processing using a second solvent, wherein all of the layers deposited preceding to this second solution-processing step are insoluble in the second solvent. A second conductive electrode layer can be deposited over the resulting stack to complete the stacked OPV cell.

As defined and used herein, organic electron donor type materials and the organic electron acceptor type materials include small molecule materials as well as polymers. In addition to fSQ, other suitable organic electron donor type materials include, but are not limited to, BTEM-PPV (Poly (2,5-bis(1,4,7,10-tetraoxaundecyl)-1,4-phenylenevinylene), Poly(3-decyloxythiophene), CuPc (copper phthalocyanine), NPD (4,4'-bis(N-(1-napthyl)phenylamino)biphenyl), pentacene, and tetracene. In addition to the fullerene disclosed herein, other suitable organic electron acceptor type materials include, but are not limited to, PCBM ([6,6]-Phenyl $C_{84}$ butyric acid methyl ester), $F_{16}$-CuPc, PTCBI (3,4,9,10 perylenetetracarboxylic bisbenzimidazole), PTCDA (3,4,9, 10 perylene-tetracarboxylic dianhydride), or Poly(benzimidazobenzo phenanthroline), TCNQ (7,7,8,8-tetracyanoquinodimethane), and F4-TCNQ (tetrafluorotetracyanoquinodimethane).

As used herein, "solution-processing", "solution-based process", "solution-based deposition" refer to solution-based deposition processes in which a material is deposited from a liquid medium, either in solution or suspension form. Such methods are often used in the fabrication process of OPVs and OLEDs and are well known to those skilled in the art. Such solution-based processes include, but are not limited to, blade-coating, slot-die coating, ink-jet printing, screen printing, gravure printing, spin-coating, etc.

Figure 1F:
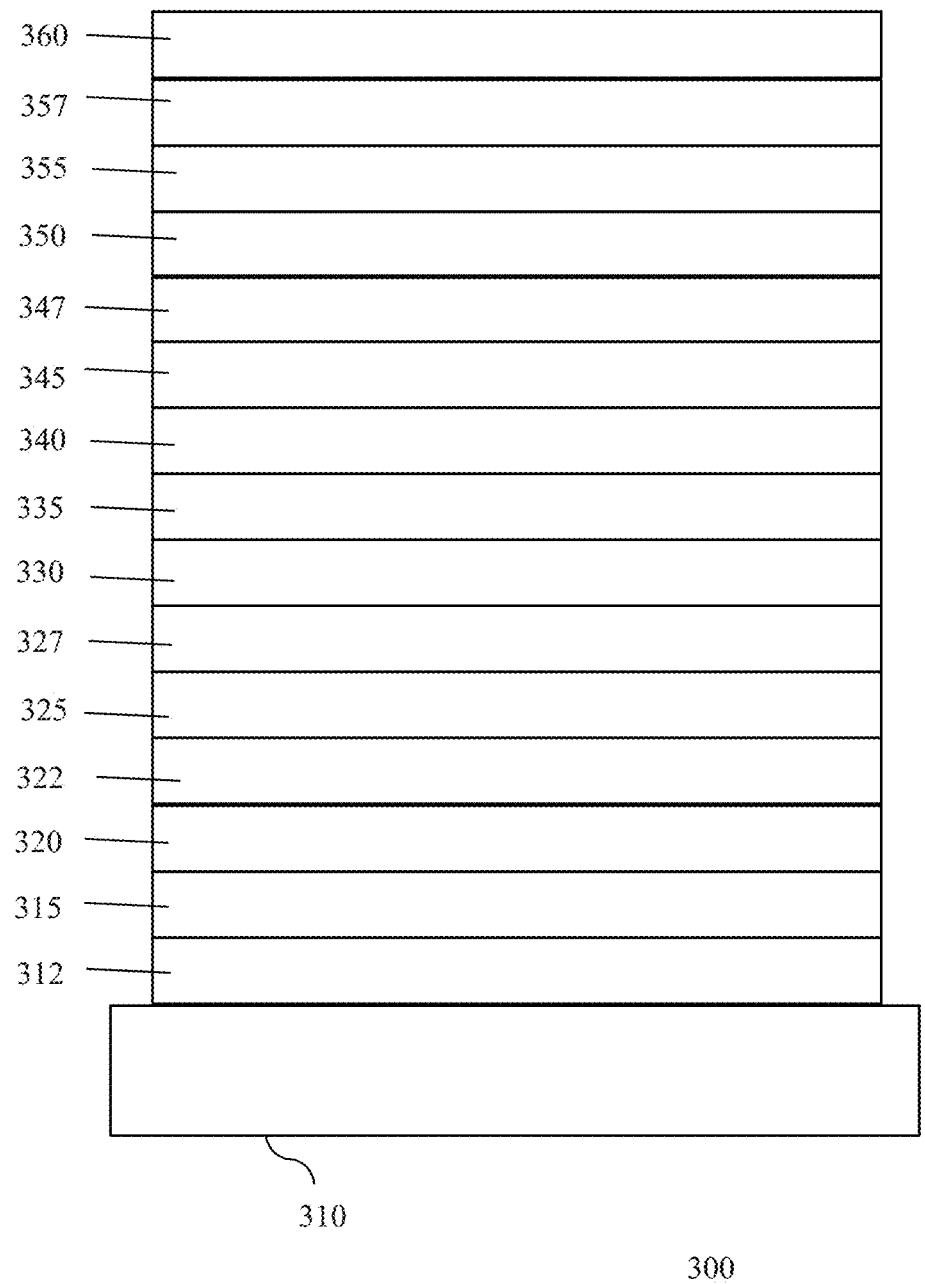
FIG. 1(f) shows cross-sectional diagram of an example of a stacked OLED device.

The disclosed method can be applied to fabrication of stacked OLED devices. For example, two or more OLED sub-cells can be stacked on top of each other, similar to the stacked OPV discussed above. The structure of such stacked OLED device 300 is shown in FIG. 1(f). The stacked OLED can be fabricated by (a) providing a substrate 310; (b) depositing a first conductive electrode layer 312 over the substrate; (c) depositing a first hole injection layer (HIL) 315 by a dry deposition process; (d) depositing a first hole transport layer (HTL) 320 by a dry deposition process; (e) depositing a first emissive layer (EML) 325 by solution-based process of an emissive material dissolved in a first solvent; (f) depositing an electron transport layer (ETL) 330 by a dry deposition process; (g) depositing a first conductive interlayer 335 by a dry deposition process; (h) depositing a second HIL 340 by a dry deposition process, (i) depositing a second HTL 345 by a dry deposition process; (j) depositing a second EML 350 by solution-based process of the emissive material dissolved in a second solvent, wherein the ETL and the conductive interlayer is insoluble in the second solvent; (k) depositing a second ETL 355 by a dry deposition process; and (l) depositing a second conductive interlayer by 360 a dry deposition process. According to an embodiment, the first emissive layer can be annealed after the step (e) but before the step (f). According to another embodiment, the second emissive layer can be annealed after the step (j) but before the step (k). As mentioned above, the annealing can be solvent vapor annealing or thermal annealing depending on the particular organic materials involved.

In the stacked OLED 300, one or more of the following optional dry deposition processed layers can also be included at the location indicated in FIG. 1(f): electron blocking layers (EBL) 322, 347, hole blocking layers (HBL) 327, 357. Such stacked OLED can be fabricated with appropriate emissive materials for the EML layer so that the two EMLs emit same color light (e.g. green+green, blue+blue, etc.) or white light (e.g. orange+blue or red+green+blue). Stacked OLEDs can be beneficial by increasing the life time of the OLED at a given power output or increasing the power output of the OLED at a given life time.

In one embodiment, the second solvent is THF and the previously a dry deposition processed layers are insoluble in THF.

A method for fabricating an OLED stack according to an aspect of the present disclosure comprises: (a) depositing a first conductive electrode layer over a substrate; (b) depositing a first set of one or more organic layers, wherein at least one of the first set of organic layers is a first emissive layer and one of the first set of organic layers is deposited by a solution-based process that utilizes a first solvent; (c) depositing a first conductive interlayer by a dry deposition process; and (d) depositing a second set of one or more organic layers, wherein at least one of the second set of organic layers is a second emissive layer and one of the second set of organic layers is deposited by a solution-based process that utilizes a second solvent, wherein all layers that precede the layer deposited using the second solvent are insoluble in the second solvent. The method can further include depositing a second conductive electrode layer or second conductive interlayer by a dry deposition process. If the OLED stack is to be completed with just two cells in the stack, the conductive layer deposited after step (d) will be a second conductive electrode layer. If the OLED stack is to have more emissive cells to be added to the stack formed through the step (d), the conductive layer deposited after step (d) will be a second conductive interlayer being provided between the second cell and the next cell.

In some embodiments, the first set of one or more organic layers deposited in step (b) by a solution-based process is a first emissive layer. In one embodiment, one or more functional layers can further be deposited by a dry deposition process before depositing the first emissive layer. These one or more functional layers can comprise a hole injection layer, a hole transport layer, and an electron blocking layer. In one embodiment, one or more functional layers can further be deposited by a dry deposition process after depositing the first emissive layer but before step (c) of depositing a first conductive interlayer by a dry deposition process.

In some embodiments, the first set of one or more organic layers deposited in step (b) by a solution-based process is a functional layer and the method further comprises depositing a first emissive layer by a dry deposition process after step (b) but before step (c). These one or more functional layers can comprise a hole blocking layer, an electron transport layer, and an electron injection layer.

According to some embodiments, the second set of one or more organic layers deposited in step (d) by a solution-based process is a second emissive layer. In one embodiment, one or more functional layers can be deposited by a dry deposition process before depositing the second emissive layer. These one or more functional layers can comprise a hole injection layer, a hole transport layer, and an electron blocking layer.

In another embodiment, one or more functional layers can be deposited by a dry deposition process after depositing the second emissive layer. These one or more functional layers can comprise a hole blocking layer, an electron transport layer, and an electron injection layer.

In some embodiments, the second set of one or more organic layers deposited in step (d) by a solution-based process is a functional layer and the method further comprises depositing a second emissive layer by a dry deposition process after step (d).

According to an aspect of the present disclosure, the method further comprises an annealing step after the first emissive layer is deposited in step (b) but before any subsequent layers are deposited. According to another aspect, the method can further comprise a second annealing step after the second emissive layer is deposited in step (d) but before any subsequent layers, if any, are deposited. The annealing steps mentioned herein can be solvent vapor annealing or thermal annealing.

According to another aspect of the present disclosure, the hole injection layers, hole transport layers, and the electron transport layers mentioned above in connection with the OLED 300 may be optionally present and not necessarily be present in all stacked OLED versions. Accordingly, a method for fabricating an OLED stack can comprise: (a) depositing a first conductive electrode layer over a substrate; (b) optionally depositing a first set of one or more functional layers by a dry deposition process; (c) depositing a first emissive layer by solution-based process of an emissive material dissolved in a first solvent; (d) optionally depositing a second set of one or more functional layers by a dry deposition process; (e) depositing a first conductive interlayer by a dry deposition process; (f) optionally depositing a third set of one or more functional layers by a dry deposition process; (g) depositing a second emissive layer by solution-based process of the emissive material dissolved in a second solvent, wherein the second set of one more functional layers, the conductive interlayer, and the third set of one or more functional layers are insoluble in the second solvent; (h) optionally depositing a fourth set of one or more functional layers by a dry deposition process; and (i) depositing a second conductive electrode layer or second conductive interlayer by a dry deposition process. In step (i) a conductive layer is deposited and that layer can be a contact electrode if the OLED stack is completed or the conductive layer can be a second conductive interlayer if another OLED cell is to be built to make the third OLED cell in the OLED stack.

In this method, the first set of one or more functional layers can comprise one or more of the following functional layers: a hole injection layer, a hole transport layer, and an electron blocking layer. The second set of one or more functional layers can comprise one or more of the following functional layers: a hole blocking layer, an electron transport layer, and an electron injection layer. The third set of one or more functional layers can comprise one or more of the following functional layers: a hole injection layer, a hole transport layer, and an electron blocking layer. The fourth set of one or more functional layers can comprise one or more of the following functional layers: a hole blocking layer, an electron transport layer, and an electron injection layer. The materials suitable for the various functional layers are well known to those skilled in the art. Some examples are discussed and disclosed herein. Those skilled in the art would know how to determine and select the materials that would be compatible with the method of the present disclosure.

In some embodiments, the method can further comprise an annealing step after step (c) of depositing a first emissive layer by solution-based process of an emissive material dissolved in a first solvent but before step (d) of optionally depositing a second set of one or more functional layers by a dry deposition process. In other embodiments, the method can further comprise a second annealing step after step (g) of depositing a second emissive layer by solution-based process of the emissive material dissolved in a second solvent, but before step (h) of optionally depositing a fourth set of one or more functional layers by a dry deposition process. The annealing steps can be solvent vapor annealing or thermal annealing.

Another example is to produce a multilayered organic hole injection layer (HIL) in an OLED device using a solution-based deposition process. Such multilayered organic HIL can have the following structure: a first organic HIL layer/$MoO_3$ layer/a second organic HIL layer. The first organic HIL layer would be deposited by a solution-based process. The $MoO_3$ layer is then deposited over the first organic HIL layer by an evaporation process (e.g. VTE). Next, the second organic HIL layer is deposited by a solution-based process. Since the intervening MoO$_3$ layer is insoluble in any organic solvents, it protects the first solution-processed organic HIL layer during the deposition of the second organic HIL by solution-based deposition process. Optionally, the first organic HIL layer can be annealed before the dry deposition processing of the MoO$_3$ layer. Further optionally, the second organic HIL layer also can be annealed. The annealing can be solvent vapor anneal or thermal anneal.

As with the stacked OPV embodiment, the stacked OLED embodiment and the multilayered HIL embodiments can be fabricated in inverted configuration with respect to the configuration described above. In the inverted configuration, the process steps described herein are implemented in the reverse order which would be readily understood by one of ordinary skill in the art.

An example of organic material for the organic HIL layer is poly(3,4-ethylenedioxythiophene) Polystyrene sulfonate PEDOT:PSS that can be used with water or propanediol as solvents. Another example of organic material for forming the organic HIL layer is a solution prepared by mixing one of the triarylamine derivatives such as Compounds 1, 2, and 3, shown below, with a conductivity dopant such as Dopant 1, shown below, using cyclohexanone as the solvent.

Compound 1

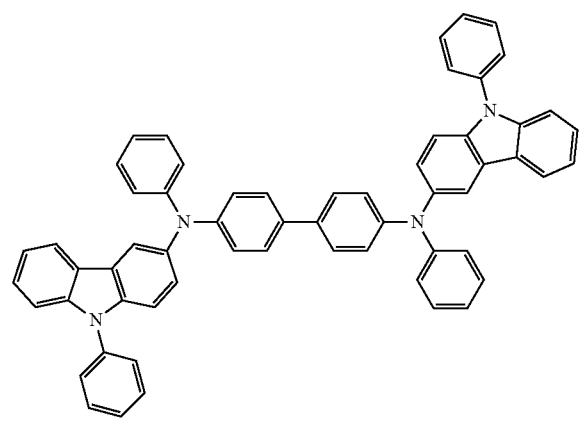

Compound 2

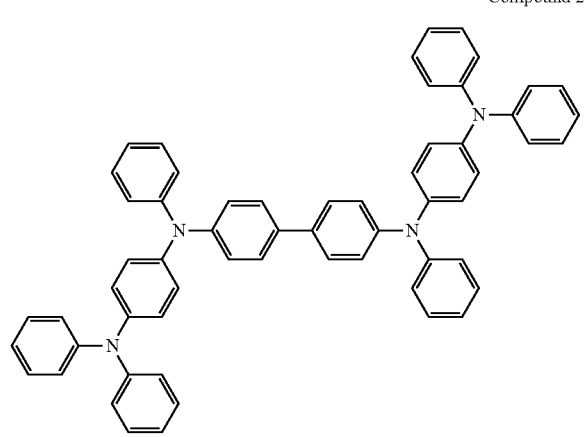

Compound 3

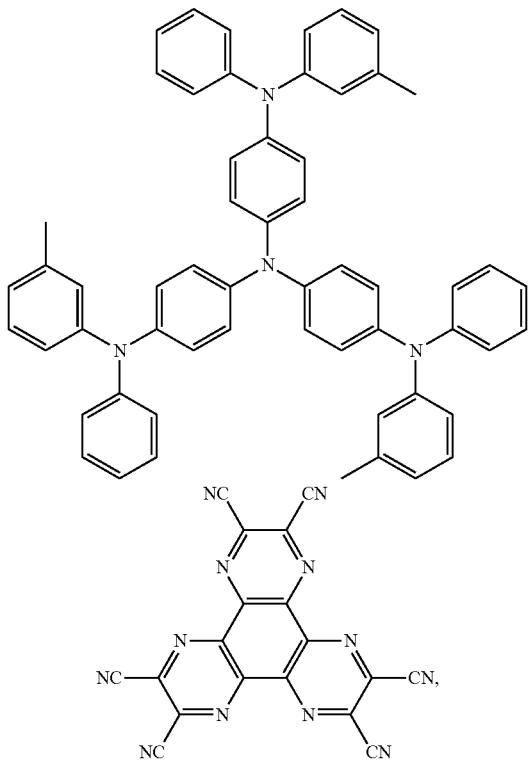

Dopant 1

EXPERIMENTAL

The novel method disclosed herein has been verified by fabricating samples of OPV devices. The devices were grown on glass substrates pre-coated with 130 nm-thick layer of indium tin oxide (ITO) with a sheet resistance of 15 Ω/□. Prior to deposition of the sub-cell structures, the ITO surface was cleaned in a surfactant and a series of solvents, and then exposed to ultraviolet-ozone for 10 minutes prior to loading into a high vacuum chamber (base pressure <10$^{-7}$ Torr) where MoO$_3$ protection layer was deposited by vacuum thermal evaporation (VTE) at ~0.1 nm/s. Substrates were subsequently transferred into a high-purity N$_2$-filled glovebox, where 15 nm-thick blended squaraine films were spin-coated at 3000 rpm from 1.9 mg/ml solutions of 4:6 volume ratio of [2-[4-(N,N-diphenylamino)-2,6-dihydroxyphenyl]-4-[4-diphenyliminio] squaraine] (DPASQ), and 2,4-bis[4-(N,N-diphenylamino)-2,6-dihydroxyphenyl] squaraine (DPSQ) dissolved in CF or THF (used for processing the "front" sub-cell adjacent to the anode, or the "back" sub-cell adjacent to the cathode, respectively) and filtered through anodic alumina membranes with a 20 nm pore size.

Substrates were returned to the high vacuum chamber in an ultrahigh purity N$_2$ environment for VTE deposition of train-sublimation-purified C$_{70}$ and a 3,4,9,10 perylenetetracarboxylic bisbenzimidazole (PTCBI) electron transporting layer at a rate of 0.1 nm/s. Some samples were transferred back into the glovebox for SVA consisting of exposure to a saturated dichloromethane vapor for a predetermined duration to create the desired nanocrystalline film morphology. For the specific material set and the film thicknesses practiced here, the exposure to a saturated dichloromethane vapor was optimized at 7.5 minutes. Generally, SVA can be from 1 minute to 60 minute exposure in a solvent vapor depending on the materials involved. SVA is well-known to one of ordinary skill in the art and one would readily understand how to implement a particular SVA condition for a given set of materials involved.

Next, the transparent charge-recombination layer consisting of a thin Ag nanoparticle layer (average thickness of 0.1 nm) and $MoO_3$ was deposited by VTE. For the back sub-cell, an identical blend of squaraines dissolved in THF was spin-cast under similar conditions, followed by evaporation of $C_{60}$ and PTCBI and SVA. The device was completed by evaporating the 100 nm-thick Ag cathode at 0.1 nm/s through a shadow mask with an array of 1 mm diameter openings. Layer thicknesses were measured using quartz crystal monitors during deposition, and ex situ by variable-angle spectroscopic ellipsometry.

Current density-vs.-voltage (J-V) characteristics of the stacked OPV sub-cells were measured in an ultra-pure $N_2$ ambient in the dark and under simulated AM1.5 G solar illumination from a filtered 300 W Xe lamp whose intensity was varied using neutral density filters. The incident light intensity of 70 mW/cm$^2$ was measured using an NREL-traceable Si detector. The efficiency is found to be nearly constant from 20 mW/cm$^2$ up to approximately 1 sun intensity. Short-circuit current densities (JO of discrete OPVs were corrected for spectral mismatch. Spectrally resolved external quantum efficiencies (EQE) were measured using monochromated light from a 150 W Xe arc-lamp using optics that under-filled the device area; optical power was calibrated with a NIST-traceable Si detector. Integration of the EQE convoluted with the solar spectrum resulted in values within ±10% of the corrected $J_{SC}$ for the single-cell devices. Errors quoted correspond to the deviation from the average value of three or more devices on the same substrate.

The stacked sub-cell J-V characteristics and EQE were modeled considering the optical field distribution within the layers, exciton diffusion, and light-intensity-dependent J-V characteristics taken from single-cell devices. The spectral mismatch factor (M) for the OPV cell stack was calculated by dividing the power conversion efficiency calculated using the lamp spectrum and that calculated using the standard solar spectrum.

Figure 2A:
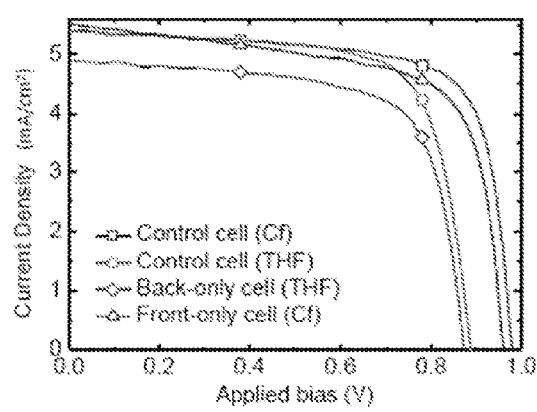
FIG. 2(a) shows current density vs. voltage (J-V) characteristics in under 70 mW/cm$^2$, simulated AM1.5G illumination for a blended functionalized squaraine/$C_{60}$ organic solar cell using a chloroform (CF) solvent (square), and a similar cell using tetrahydrofuran (THF) solvent (circle), a cell using THF (diamond) for positioning near the cathode of the stacked cells (back-only cell), and a cell for positioning near the transparent anode (front-only cell) using CF (triangle).
Figure 2B:
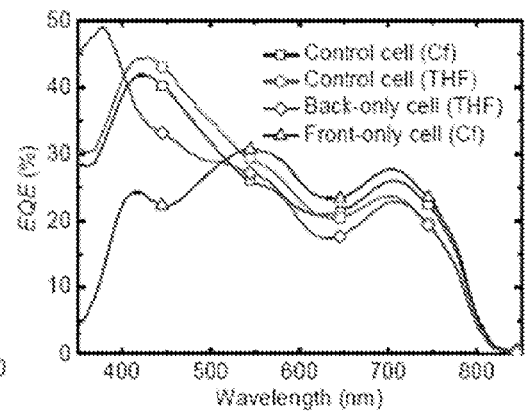
FIG. 2(b) shows external quantum efficiencies (EQEs) for the cells in FIG. 2(a).

In order to separately characterize the sub-cell performances, the individual cells were fabricated and tested with the following structure: glass/ITO/25 nm $MoO_3$/15 nm blended fSQ/40 nm $C_{60}$/8 nm PTCBI/100 nm Ag, where the blend was dissolved in either CF or THF, and then annealed by solvent vapor annealing after deposition of the PTCBI buffer layer. The SVA consisted of exposure to a saturated dichloromethane vapor for 7.5 minutes. The J-V characteristics under illumination is shown in FIG. 2(a), and the EQE spectra are shown in FIG. 2(b), with device performance parameters summarized in Table I. The CF-solubilized cell had $V_{OC}$=0.96±0.01 V, fill factor (FF)=73±1%, responsivity (R)=7.7±0.3×10$^{-2}$ A/W, and $\eta_P$=5.5±0.2%, which is within experimental error of previously reported results for analogous devices. The THF-based cell had $V_{OC}$=0.89±0.02 V, FF=71±1%, R=7.7±0.3×10$^{-2}$ A/W, and $\eta_P$=4.9±0.2%. The decrease in $V_{OC}$ compared to the CF-based cell is likely due to a difference in phase segregation between the two fSQ molecules, leading to increased recombination at the donor-acceptor junction.

To simulate the damage to the underlying layers caused by the spin-coating of a second solution-based material onto its surface, we investigated the effects of spinning THF on the top of the following multi-layer film structure: glass/ITO/25 nm $MoO_3$/15 nm blended fSQ (spun on using CF)/10 nm $C_{70}$/5 nm PTCBI/0.1 nm Ag/x $MoO_3$, where x=5 or 20 nm. The optical micrograph FIG. 3(a) and the atomic force micrograph FIG. 3(b) correspond to the case of a solvent vapor annealed sample with x=5 nm. The multi-layer film structure was not exposed to THF, resulting in a film that appears featureless under microscopic examination. The surface morphology of the film is similar to that of the ITO, with a root-mean-square (RMS) roughness of 1.5 nm. The optical micrograph FIG. 3(c) and the atomic force micrograph 3(d) show as-cast film with x=5 nm where THF was spun on the top of the same structure. The film significantly roughen to a RMS=4.9 nm due to re-dissolution of the underlying fSQ layers. In the optical micrograph FIG. 3(e) and the atomic force micrograph 3(f), the multi-layer film structure for an x=5 nm sample was solvent vapor annealed after the PTCBI layer is deposited, followed by spinning of THF onto the surface. The film contains ~1 μm-diameter by 10 nm-high protrusions covering ~10% of its surface, suggesting that solvent has penetrated into the underlying layers resulting in swelling. Outside the damaged area exhibited RMS=1.5 nm, similar to the unexposed case. As the $MoO_3$ thickness is increased, the density of these protrusions decreases and are nearly eliminated for x=20 nm (FIGS. 3(g) and 3(h)).

Figure 3:
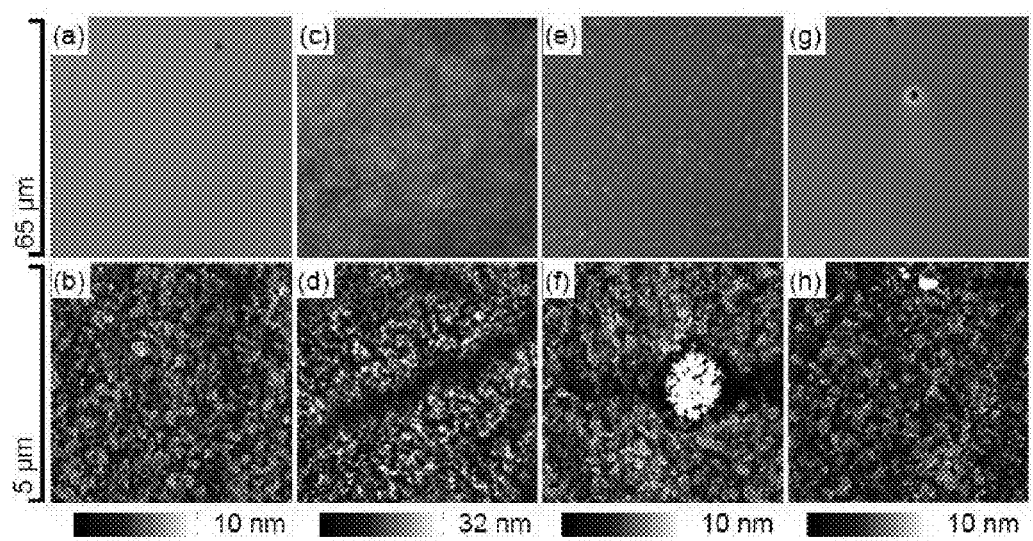
FIG. 3 shows optical (top row) and atomic force (bottom row) micrographs for samples having undergone different processing procedures: (a, b) solvent-vapor annealed (SVA), no THF exposure; (c, d) as-cast, 5 nm $MoO_3$ layer, THF exposure; (e, f) SVA, 5 nm $MoO_3$ layer, THF exposure; (g, h) SVA, 20 nm $MoO_3$ layer, THF exposure. The vertical scales for the bottom row of micrographs are indicated below each image.

Re-dissolution caused by the deposition of the second solution-processed layer can be minimized in two ways. First, as shown in FIG. 3, SVA decreases the radius of the defects caused by the exposure to the second THF solution. The roughness of the sample in FIG. 3(f) is the same as that of the unexposed film in FIG. 3(b), indicating that solvent penetrates only through pinholes. The SVA increases the density of the the donor and acceptor layers as they reorganize and crystalize, filling in some of the voids in the as-cast film. This limits the area of exposure to solvent penetration that otherwise results in significant local roughening (see FIG. 3(c)).

Figure 4:
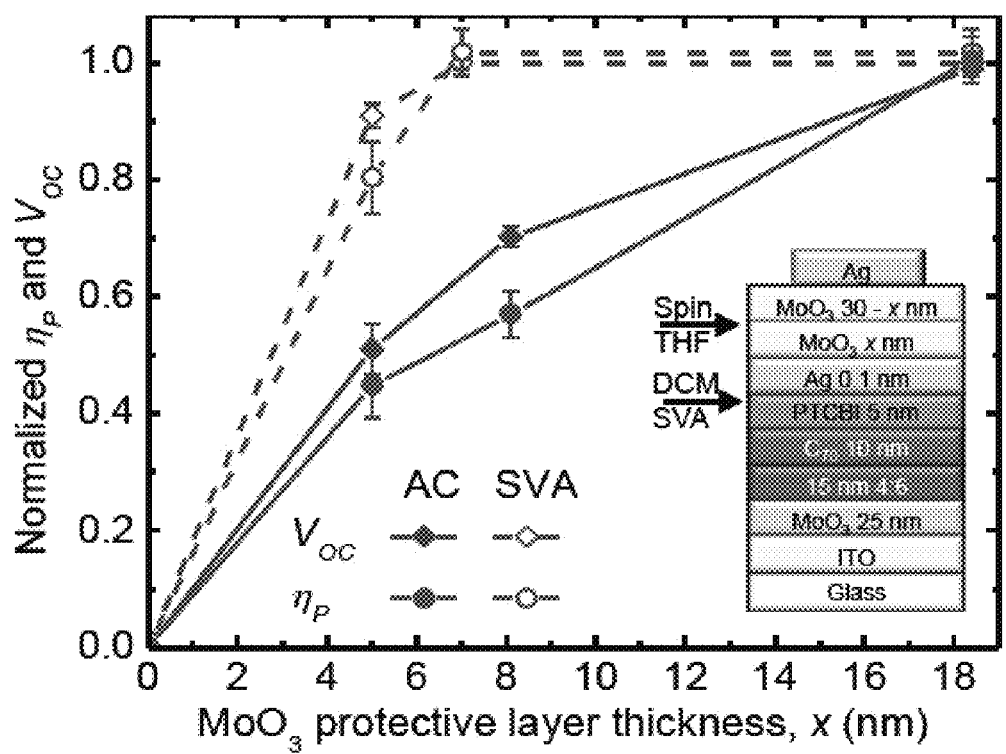
FIG. 4 shows power conversion efficiencies ($\eta_P$, circles) and open-circuit voltages ($V_{OC}$, diamonds) for front-only single cells exposed to THF as a function of the $MoO_3$ layer thickness, normalized to values for cells unexposed to THF. As-cast cell data are indicated by closed symbols, while solvent-vapor-annealed (SVA) cells are indicated by open symbols.

Additionally, the damage from applying the second solution-processed layer can be further decreased by increasing the $MoO_3$ protection layer thickness. The plot in FIG. 4 shows that, for the case of as-cast films exposed to THF, ~20 nm of $MoO_3$ is necessary to achieve the same performance as cells unexposed to the solution. By combining both approaches—a SVA-processed device with a $MoO_3$ protection layer of 7 nm—the same power conversion efficiency is achieved as an analogous device that has not been exposed to THF. The thin $MoO_3$ layer allows for the optimal placement of the cells in the optical field, thereby resulting in a high $J_{SC}$.

We fabricated a series of devices to simulate the behavior of the front sub-cell (i.e. that positioned closest to the ITO anode in the stack) using the following structure: glass/ITO/25 nm $MoO_3$/15 nm blended fSQ (CF)/10 nm $C_{70}$/5 nm PTCBI/0.1 nm Ag/x nm $MoO_3$/30-x nm $MoO_3$/100 nm Ag. These cells were fabricated by vacuum depositing the $MoO_3$ layer on ITO, spinning on the blended fSQ, and the vacuum depositing both the $C_{70}$, and PTCBI layers. Some films were subsequently solvent vapor annealed. The second $MoO_3$ layer was then deposited (with x=0 to 18 nm) and exposed to spin cast THF, thereby simulating the effects of the deposition of a second blended fSQ layer. The devices were completed by depositing the final layer of $MoO_3$ and Ag, keeping the total amount of $MoO_3$ constant for all samples.

FIG. 4 shows a plot of $V_{OC}$ (diamonds) and $\eta_P$ (circles) for as-cast (AC, filled points) and SVA (open points) cells as functions of x, where both parameters are normalized to their values for similar cells unexposed to THF. For both AC and SVA cells, x=0 (i.e. no $MoO_3$ protection layer) leads to device shorts. As x increases, $V_{OC}$ and $\eta_P$ increase monotonically. The AC cell performance is similar to that of the unexposed cell at x=18 nm, while the SVA cell requires only x=7 nm. This is consistent with the images in FIG. 3, where there is substantially more damage to the AC films compared to the SVA films at x=5 nm.

We also fabricated a stacked structure using the optimized $MoO_3$ protection layer thicknesses coupled with solvent vapor annealing of the lower sub-cell. The discrete cell with a design optimized for the position nearest to the anode (i.e. a front-only cell) had the same structure as above with x=7 nm, while the cathode-optimized (back-only) cell has the structure: glass/ITO/25 nm $MoO_3$/15 nm blended fSQ (dissolved in THF)/28 nm $C_{60}$/5 nm PTCBI/100 nm Ag, layer. The front-only and back-only J-V and EQE data are shown in FIG. 2 and summarized in Table I below. The stacked OPV structure using these sub-cells is: glass/ITO/25 nm $MoO_3$/15 nm blended fSQ (CF)/10 nm $C_{70}$/5 nm PTCBI/0.1 nm Ag/7 nm $MoO_3$/15 nm blended fSQ (THF)/28 nm $C_{60}$/5 nm PTCBI/100 nm Ag, with the layers solvent annealed after deposition of each PTCBI layer. The optimized stacked OPV structure had $V_{OC}$=1.78±0.01 V, FF=67±1%, R=4.9±0.02×10$^{-2}$ A/W, and $\eta_P$=6.2±0.3%, (with a spectral mismatch factor M of 0.95±0.01).

Figure 5A:
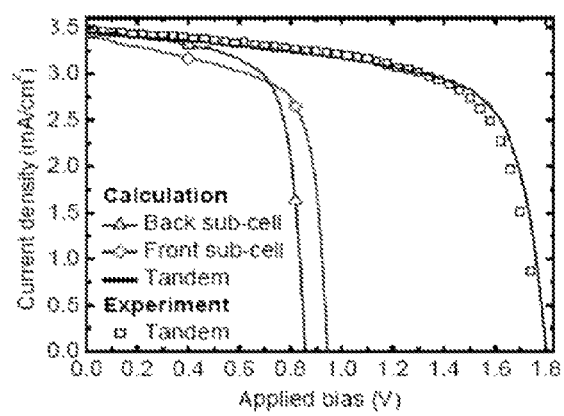
FIG. 5(a) shows current density vs. voltage (J-V) characteristics in the $4^{th}$ quadrant under 70 $mW/cm^2$, simulated AM1.5G illumination for the optimized stacked cells (squares), along with the calculated J-V characteristics for the stacked cells (line), back-only sub-cell (triangle), and front-only sub-cell (diamond).
Figure 5B:
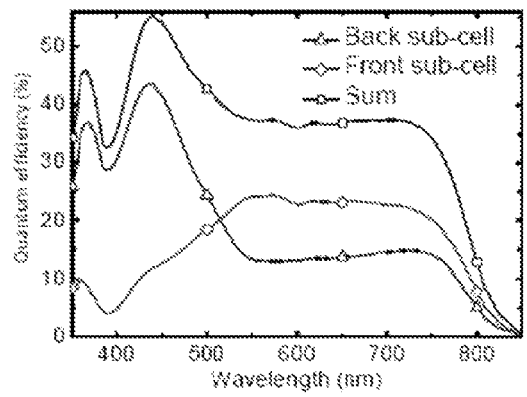
FIG. 5(b) shows quantum efficiency calculations for the back-only sub-cell (triangle) and front-only sub-cell (diamond). The calculated sum of these two curves (square) represents the total photon harvesting efficiency for the stacked cells.

The experimental and calculated J-V characteristics shown in FIG. 5(a) are in agreement, indicating the absence of significant damage to the front sub-cell due to either the deposition of the second blended fSQ layer, or from subsequent SVA. The EQEs of each sub-cell shown in FIG. 5(b) show less curvature at λ=650 nm than for the single-cell in FIG. 2(b). This results since >90% of the photons are absorbed between 550 nm<λ<720 nm in the blended 30 nm thick (total) fSQ layers. While the total quantum efficiency of the stacked OPV structure is limited due to significant spectral overlap between the active materials in the front and back sub-cells, there is nevertheless a >25% increase compared to the optimized discrete cell. The FF of the stack is similar to that of the discrete devices, and the stack's $V_{OC}$=1.78±0.01 V is nearly equal to the sum of the respective discrete cells of $V_{OC}$=1.84±0.02 V, indicating that there is efficient charge transport and recombination in the interlayer between the sub-cells. Overall, $\eta_P$ for the stack is 12% higher than that of the optimized discrete cells

TABLE I

Organic photovoltaic performance under 70 mW/cm$^2$ simulated AM1.5G illumination, corrected for spectral mismatch.

| Device | Data | Solvent | $V_{OC}$ (V)$^a$ | FF (%)$^b$ | R ($10^{-2}$ A/W)$^c$ | $\eta_p$ (%) | M$^a$ |
|---|---|---|---|---|---|---|---|
| Control | Exp. | CF | 0.96 | 73 | 7.7 | 5.5 ± 0.2 | 0.98 |
| Control | Exp. | THF | 0.89 | 71 | 7.7 | 4.9 ± 0.2 | 0.98 |
| Back-only | Exp. | THF | 0.88 | 69 | 7.0 | 4.2 ± 0.2 | 1.00 |
| Front-only | Exp. | CF | 0.96 | 67 | 7.8 | 5.0 ± 0.2 | 0.96 |
| Back sub-cell | Calc. | THF | 0.86 | 70 | 5.0 | 3.0 | 0.98 |
| Front sub-cell | Calc. | CF | 0.94 | 69 | 5.2 | 3.4 | 0.92 |
| Stacked | Calc. | Both | 1.80 | 70 | 5.1 | 6.4 | 0.95 |
| Stacked | Exp. | Both | 1.78 | 67 | 4.9 | 6.2 ± 0.3 | 0.95 |

Experimental errors:
$^a$±0.01,
$^b$±1,
$^c$±0.3.

In summary, the inventors have demonstrated a small molecule stacked OPV consisting of two solution- and vapor-processed, blended functionalized-squaraine/fullerene sub-cells separated by a thin and insoluble $MoO_3/C_{60}$ protective interlayer. The relatively low solubility of fullerenes in THF minimizes penetration of the solvent into the underlying blended fSQ donor layer, thereby minimizing layer dissolution and damage. Damage was further reduced by solvent vapor annealing of the front sub-cell, where the increased crystallinity of the blended-fSQ layer simultaneously improved the sub-cell performance and reduced the damage associated with solvent penetrating the previously deposited layers. The resulting stacked OPV structure has a power conversion efficiency of 6.2±0.3% and an open circuit voltage of $V_{OC}$=1.78±0.01 V, or nearly the sum of the constituent sub-cells.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. A method for fabricating an organic light emitting device stack, the method comprising:
    (a) depositing a first conductive electrode layer over a substrate;
    (b) depositing a first set of one or more organic layers, wherein at least one of the first set of organic layers is a first emissive layer and one of the first set of organic layers is deposited by a solution-based process that utilizes a first solvent;
    (c) depositing a first conductive interlayer by a dry deposition process; and
    (d) depositing a second set of one or more organic layers, wherein at least one of the second set of organic layers is a second emissive layer and one of the second set of organic layers is deposited by a solution-based process that utilizes a second solvent, wherein all layers that precede the layer deposited using the second solvent are insoluble in the second solvent.

2. The method of claim 1, further comprising depositing a second conductive electrode layer or second conductive interlayer by a dry deposition process.

3. The method of claim 1, wherein the first set of one or more organic layers is a first emissive layer.

4. The method of claim 3, further comprising depositing one or more functional layers by a dry deposition process before depositing the first emissive layer.

5. The method of claim 3, further comprising depositing one or more functional layers by a dry deposition process after depositing the first emissive layer but before step (c).

6. The method of claim 1, wherein the first set of one or more organic layers is a functional layer and the method further comprises depositing a first emissive layer by a dry deposition process after step (b) but before step (c).

7. The method of claim 4, wherein the one or more functional layers comprises: a hole injection layer, a hole transport layer, and an electron blocking layer.

8. The method of claim 5, wherein the one or more functional layers comprises: a hole blocking layer, an electron transport layer, and an electron injection layer.

9. The method of claim 1, wherein the second set of one or more organic layers is a second emissive layer.

10. The method of claim 9, further comprising depositing one or more functional layers by a dry deposition process before depositing the second emissive layer.

11. The method of claim 10, further comprising depositing one or more functional layers by a dry deposition process after depositing the second emissive layer.

12. The method of claim 1, wherein the second set of one or more organic layers is a functional layer and the method further comprises depositing a second emissive layer by a dry deposition process after step (d).

13. The method of claim 10, wherein the one or more functional layers comprises: a hole injection layer, a hole transport layer, and an electron blocking layer.

14. The method of claim 11, wherein the one or more functional layers comprise: a hole blocking layer, an electron transport layer, and an electron injection layer.

15. The method of claim 1, further comprising an annealing step after step (b) but before step (c).

16. The method of claim 15, wherein the annealing step is solvent vapor annealing or thermal annealing.

17. The method of claim 15, further comprising a second annealing step after step (d).

18. The method of claim 17, wherein the annealing steps are solvent vapor annealing or thermal annealing.

19. A method for fabricating an organic light emitting device stack, the method comprising:
    (a) depositing a first conductive electrode layer over a substrate;
    (b) optionally depositing a first set of one or more functional layers by a dry deposition process;
    (c) depositing a first emissive layer by solution-based process of an emissive material dissolved in a first solvent;
    (d) optionally depositing a second set of one or more functional layers by a dry deposition process;
    (e) depositing a first conductive interlayer by a dry deposition process;
    (f) optionally depositing a third set of one or more functional layers by a dry deposition process;
    (g) depositing a second emissive layer by solution-based process of the emissive material dissolved in a second solvent, wherein the second set of one more functional layers, the conductive interlayer, and the third set of one or more functional layers are insoluble in the second solvent;
    (h) optionally depositing a fourth set of one or more functional layers by a dry deposition process; and
    (i) depositing a second conductive electrode layer or second conductive interlayer by a dry deposition process.

20. The method of claim 1, wherein the first set of one or more functional layers comprises: a hole injection layer, a hole transport layer, and an electron blocking layer.

21. The method of claim 1, wherein the second set of one or more functional layers comprises: a hole blocking layer, an electron transport layer, and an electron injection layer.

22. The method of claim 1, wherein the third set of one or more functional layers comprises: a hole injection layer, a hole transport layer, and an electron blocking layer.

23. The method of claim 1, wherein the fourth set of one or more functional layers comprise: a hole blocking layer, an electron transport layer, and an electron injection layer.

24. The method of claim 1, further comprising an annealing step after step (c) but before step (d).

25. The method of claim 24, wherein the annealing step is solvent vapor annealing or thermal annealing.

26. The method of claim 24, further comprising a second annealing step after step (g) but before step (h).

27. The method of claim 26, wherein the annealing steps are solvent vapor annealing or thermal annealing.

* * * * *